United States Patent [19]

Tsukada

[11] Patent Number: 5,264,919
[45] Date of Patent: Nov. 23, 1993

[54] APPARATUS FOR POSITIONING A SEMICONDUCTOR WAFER

[75] Inventor: Kouki Tsukada, Kawasaki, Japan

[73] Assignee: Kabushiki Kaisha Toshiba, Kawasaki, Japan

[21] Appl. No.: 860,436

[22] Filed: Mar. 30, 1992

[30] Foreign Application Priority Data

Apr. 19, 1991 [JP] Japan .................................. 3-088634

[51] Int. Cl.⁵ .............................................. G01B 11/00
[52] U.S. Cl. .................................... 356/401; 250/548; 382/8
[58] Field of Search ...................... 356/399, 400, 401; 250/548; 382/8; 358/101

[56] References Cited

U.S. PATENT DOCUMENTS

4,757,550 7/1988 Uga .......................................... 382/8

Primary Examiner—F. L. Evans
Attorney, Agent, or Firm—Oblon, Spivak, McClelland, Maier & Neustadt

[57] ABSTRACT

An apparatus for positioning a semiconductor wafer on which a pattern of circuits with a reference mark is formed consists of a radiation section for radiating a light to the wafer, a multi-visual-field mirror pipe for optically branching the light into a plurality of lights, magnifying lenses for respectively magnifying the branched lights, photoelectric transferring devices for transferring the magnified lights into picture signals, a pattern recognition and calculation section for automatically recognizing the reference mark of the pattern and for calculating the difference between a target position and the position of the reference mark, position correcting sections for determining the movement of the wafer in X and Y directions to reduce the difference to zero, a moving section for moving the wafer in the X and Y directions according to the movement of the wafer, and a control section for controlling the order of the branched lights which are processed by the pattern recognition and calculation section.

9 Claims, 4 Drawing Sheets

APPARATUS FOR POSITIONING A SEMICONDUCTOR WAFER

BACKGROUND OF THE INVENTION

1. Field of the Invention

The present invention relates to an apparatus for positioning a semiconductor wafer, and, in particular, to an apparatus for positioning a semiconductor wafer in which a pattern of circuits is formed.

2. Description of Background

Figures 1A, 1B:
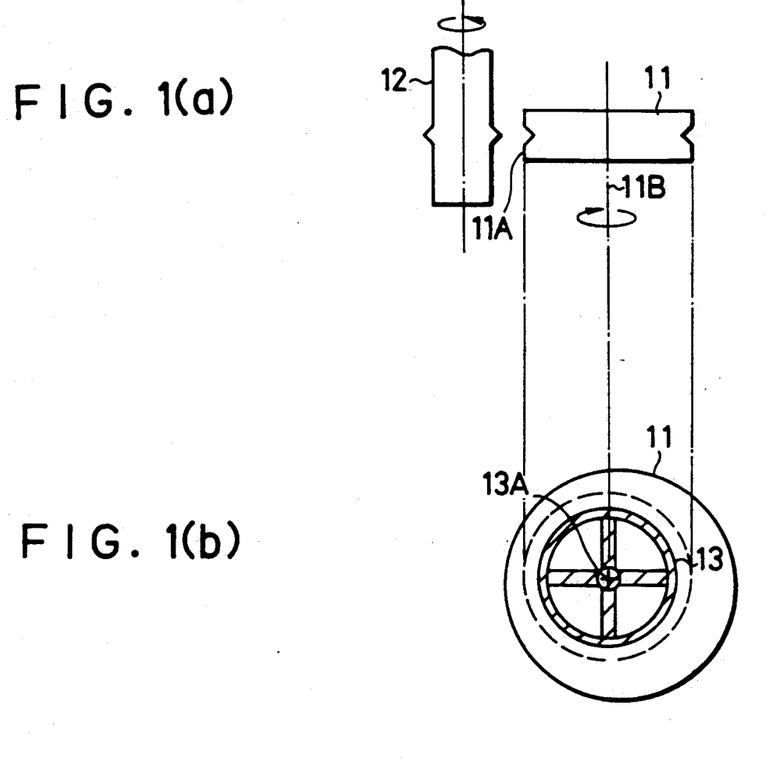
FIG. 1(a) is a cross sectional view of a wafer and a grindstone for grinding the side surface of the wafer to a Σ structure.
FIG. 1(b) is a plan view of a wafer with circuits, the center of the circuit agreeing with the rotational axis of the rotated wafer as shown in FIG. 1(a).

Usually, a disk type of semiconductor wafer is subjected to a facing processing in which the side surface of the wafer is, for example, ground to a Σ structure or a tapered structure. That is, as shown in FIG. 1(a), the side surface 11A of a disk type of rotated wafer 11 is ground by a grindstone 12. In this case, the rotational axis 11B of the rotated wafer 11 must agree with the center 13A of a pattern of circuits 13 as shown in FIG. 1(b). However, the center 13A of the pattern of circuits 13 does not agree with the center of the wafer 11.

Therefore, the wafer 11 must be positioned to set the center 13A of the pattern of circuits 13 at the rotational axis 11B of the wafer 11.

Figure 2:
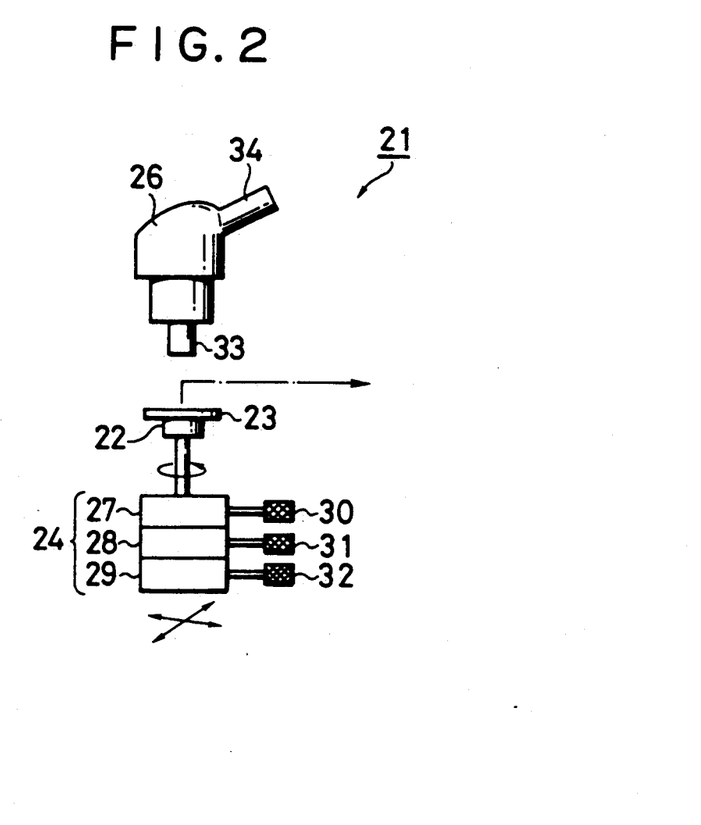
FIG. 2 is a side view of a conventional apparatus for positioning a semiconductor wafer, showing constituent members of the apparatus.

A conventional apparatus for positioning a semiconductor wafer is shown in FIG. 2.

Figure 3A:
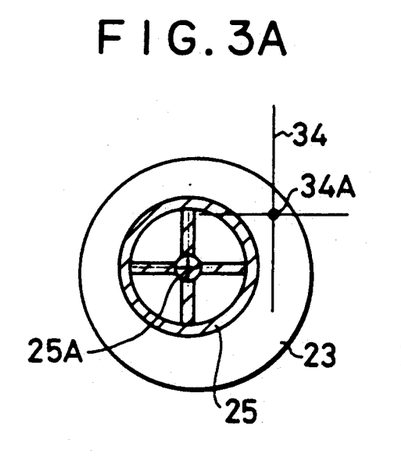
FIG. 3A is a plan view of a wafer, the view being enlarged by a microscope before the position of the wafer is adjusted.

As shown in FIG. 2, a conventional apparatus 21 for positioning a semiconductor wafer comprises:

a wafer holder 22 for holding a disk type of wafer 23;

a positioning stage 24 for moving the wafer holder 22 to set the wafer 23 at a prescribed position, a reference point 25A being marked on the center of circuits 25 formed on the wafer 23 as shown in FIG. 3A; and a microscope 26 for magnifying the wafer 23 to observe the real image of the circuits 25 formed on the wafer 23.

The positioning stage 24 comprises:

an X-axis stage 27 for moving the wafer 23 in an X-axis direction;

a Y-axis stage 28 for moving the wafer 23 in an Y-axis direction;

a θ-axis stage 29 for rotating the wafer 23 on an X-Y plane;

an X-axis adjuster 30 for adjusting the movement of the wafer 23 in the X-axis direction by turning a knob by hand;

an Y-axis adjuster 31 for adjusting the movement of the wafer 23 in the Y-axis direction by turning a knob by hand; and an θ-axis adjuster 32 for adjusting the rotation of the wafer 23 on the X-Y plane by turning a knob by hand.

The microscope 26 comprises:

an objective 33 for facing the wafer 23 on the wafer holder 22; and an eyepiece 34 with a cross shaped of adjusting lines 34 shown in FIG. 3A.

In the above configuration of the conventional apparatus 21, the wafer 23 is initially put on the wafer holder 22 so that the wafer 23 is fixed by evacuating the wafer holder 22 by a vacuum system. Thereafter, the microscope 26 is focused on the wafer 23 by an operator. At this time, the operator can observe the circuits 25 formed on the wafer 23 as shown in FIG. 3A.

Figure 3B:
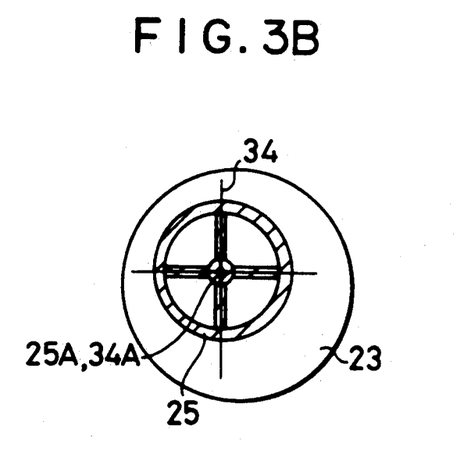
FIG. 3B is a plan view of a wafer, the view being enlarged by a microscope after the position of the wafer is adjusted.

Thereafter, the operator adjusts the X, Y, θ-axis adjusters 30, 31, 32 to position an intersection point 34A of the adjusting lines 34 at the reference point 25A marked on the center of circuits 25 as shown in FIG. 3B. At this time, the operator keeps to observe the circuits 25 through the microscope 26. After this adjustment, the operator can observe the circuits 25 formed on the wafer 23 as shown in FIG. 3B. That is, the reference point 25A marked on the center of circuits 25 agrees with the intersection point 34A of the adjusting lines 34.

Accordingly, a process for positioning the wafer 23 is completed by the above adjustment.

Thereafter, the wafer 23 is transferred to a next processing stage to implement the facing processing by moving a prescrived distance. Or, in cases where the positioning of the wafer 23 is required in a high precision, the processing stage such as the grindstone 12 for implementing the facing processing is transferred to the side of the wafer 23 so that the facing processing is implemented without transferring the wafer 23.

However, there are many drawbacks in the positioning process. That is, the adjustment for positioning the wafer 23 is implemented by hand so that the operator must engage in the positioning process for a long time. Therefore, the positioning process is troublesome.

In addition, the operator is subjected to the fatigue of the eyes because the operator must keep to observe the circuits 25 and the adjusting lines 34 with his eyes like saucers for a long time. Therefore, the productivity is decreased, and the quality of the semiconductor device manufactured by implementing the facing process deteriorates.

Moreover, in cases where the size of the circuits formed on the wafer 23 is changed because the dimensions of the wafer 23 is changed, the positioning allowance is changed. For example, the dimensions of the wafer 23 is changed from 6 inch to 4 inch, the positioning allowance is reduced. Therefore, the positioning are required in a higher precision. In this case, both the objective 33 and the eyepiece 34 of the microscope 26 must be changed for each size of wafer 23.

Further, because the operator must judge with his eyes whether or not the reference point 25A of the circuits 25 agrees with the intersection point 34A of the adjusting lines 34, the operator must turn the θ-axis adjuster 32 to easily make a judgment. That is, the operator must turn the three type of knobs.

Therefore, the improvement in the positioning process is strongly required.

SUMMARY OF THE INVENTION

An object of the present invention is to provide, with due consideration to the drawbacks of such conventional device, an apparatus for positioning a semiconductor wafer in which the time for the positioning process is shortened, and the positioning precision is improved.

The above object is achieved by the provision of an apparatus for positioning a semiconductor wafer, on which a pattern of circuits with a reference mark is formed, at a target position comprising:

light radiating means for radiating a light to the wafer held on a holding stage, the light being reflected on the wafer;

light branching means for optically branching the light which is radiated from the light radiating means and is reflected on the wafer into a plurality of lights, a real image of the pattern being imaged in each branched light;

branched light magnifying means for respectively magnifying the lights branched by the light branching means in a range from low magnification to high magnification, the magnifications of the branched lights differing from one another;

photoelectric transferring means for transferring each branched light magnified by the branched light magnifying means into picture signals;

pattern recognizing and calculation means for automatically recognizing the reference mark of the pattern imaged in each branched light which is transferred into the picture signals by the photoelectric transferring means, and for calculating the difference between the target position and the position of the reference mark, the target position being stored in advance;

movement determining means for determining the movement of the wafer in X and Y directions to reduce the difference calculated by the pattern recognizing and calculation means to zero;

moving means for moving the wafer held on the holding stage in the X and Y directions according to the movement of the wafer determined by the movement determining means; and control means for controlling the order of the branched lights which are processed by the pattern recognizing and calculation means, (1) the branched lights being controlled in the order in which the magnification of the branched light increases, (2) the wafer being repeatedly moved by the moving means according to each movement of the wafer determined by utilizing the branched light of which the order is controlled by the control means, and (3) the position of the reference mark on the wafer finally agreeing with the target position by moving the wafer of which the movement is determined by utilizing the branched light magnified at highest magnification.

In the above configuration of the apparatus, the light radiated from the radiation means is reflected on the wafer so that the reflected light is transmitted to the light branching means. In the light branching means, the reflected light is optically branched into a plurality of lights to magnify to various kinds of optical magnifications in the branched light magnifying means. Each magnified light is then transferred into the picture signals by the photoelectric transferring means.

Thereafter, the picture signals obtained by transferring the branched light magnified at the lowest magnification are first transmitted to the pattern recognizing and calculation means under the control of the control means.

In the pattern recognizing and calculation means, the reference mark of the pattern on the wafer is recognized, and the difference between the position of the reference mark and the target position is calculated. In this case, the target position is stored in advance by an operator. The difference is then transmitted to the movement determining means.

In the movement determining means, the movement of the wafer is determined to reduce the difference to zero.

Thereafter, the wafer is moved by the moving means to reduce the difference to zero according to the movement of the wafer. In this case, because the movement of the wafer is determined by utilizing the picture signals obtained by transferring the branched light magnified at the low magnification, the difference is not precisely reduced to zero. In other words, the wafer is roughly positioned by utilizing the branched light magnified at the low magnification.

To precisely position the wafer, the process in the pattern recognizing and calculation means, the movement determining means, and the moving means are repeated by utilizing the picture signals obtained by transferring the branched light magnified at higher magnification.

When the branched light magnified at highest magnification is utilized, the difference between the position of the reference mark and the target position is precisely reduced to zero. In other words, the wafer is precisely positioned.

Accordingly, because the real image of the pattern is transferred into the picture signals, the wafer can be automatically positioned.

In addition, because the picture signals obtained by transferring the magnified lights are processed in the order from the branched light magnified at the lowest magnification to the branched light magnified at the highest magnification, the position of the wafer can be gradually moved so that the difference between the position of the reference mark and the target position is necessarily reduced to zero.

Moreover, because the branched light magnified at the highest magnification is finally utilized, the wafer can be precisely positioned.

DETAILED DESCRIPTION OF THE PREFERRED EMBODIMENTS

Preferred embodiments of an apparatus for positioning a semiconductor wafer according to the present invention are described with reference to drawings.

Figure 4:
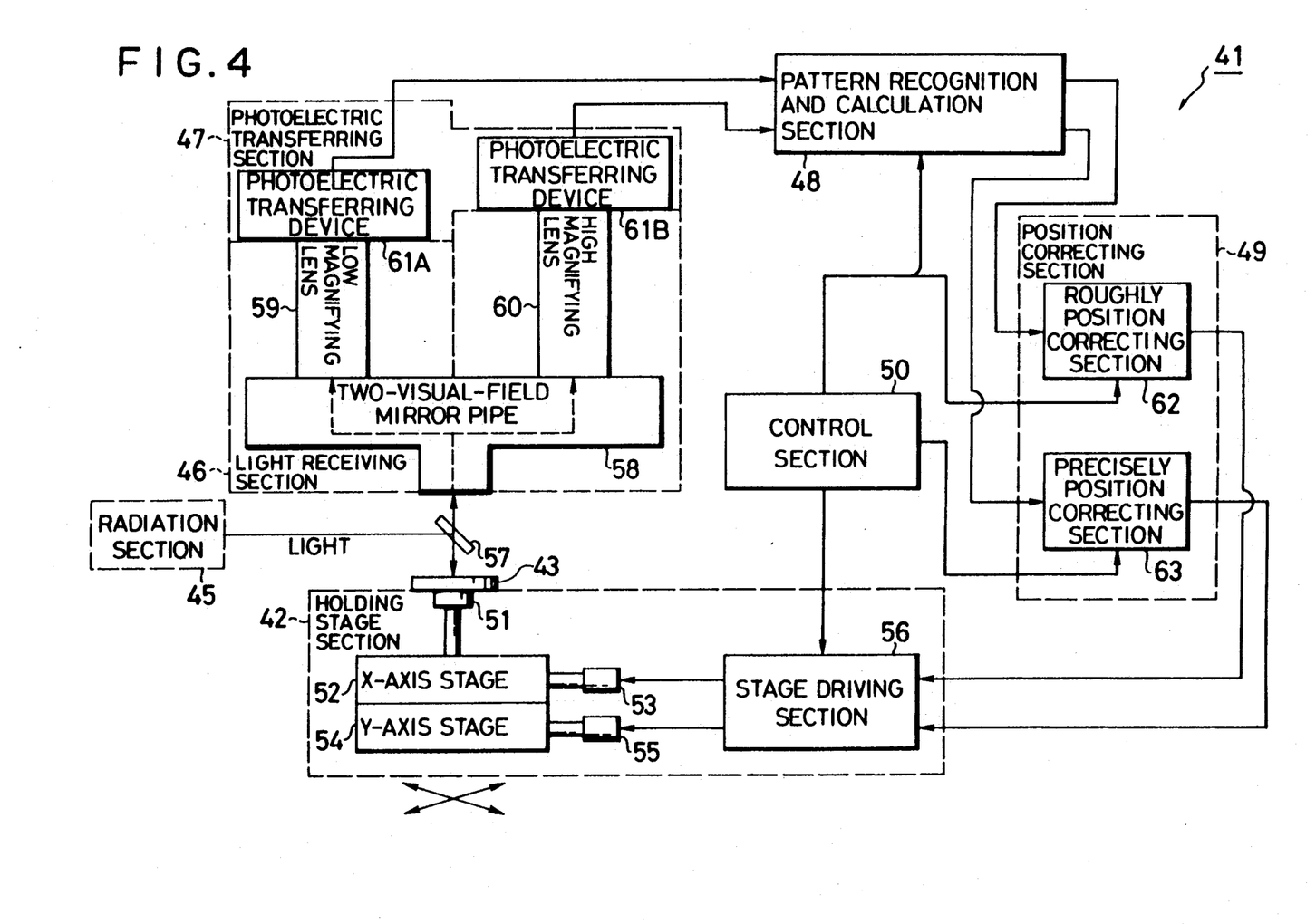
FIG. 4 is a block diagram of an apparatus for positioning a semiconductor wafer according to the present invention.

FIG. 4 is a block diagram of an apparatus for positioning a semiconductor wafer according to the present invention.

Figure 5:
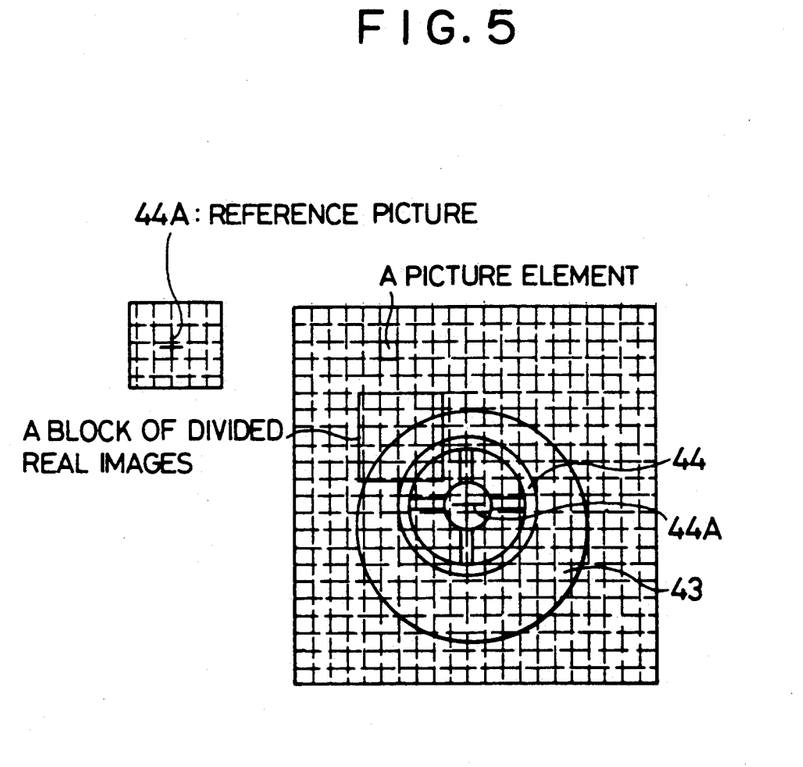
FIG. 5 is a plan view showing the real image of a pattern of circuit formed on a wafer, the real image being divided into a large number of picture elements in an X-Y plane.

As shown in FIG. 4, an apparatus 41 for positioning a semiconductor wafer comprises:

a holding stage section 42 for holding a disk type of semiconductor wafer 43, (1) the holding stage section 42 being movable in X and Y directions, (2) a pattern of circuits 44 shown in FIG. 5 being formed on the wafer 43, (3) a reference picture 44A shown in FIG. 5 being marked in the center of the pattern 44 at a prescribed dimensions, and (4) the wafer 43 being moved so as to set the reference picture 44A at a target position;

a radiation section 45 for radiating a light over the entire wafer 43 and leading the light reflected from the wafer 43 in an upper direction of the wafer 43, a real image of the pattern 44 being imaged in the reflected light;

a light receiving section 46 arranged over the holding stage section 42 for receiving the light reflected on the wafer 43, the real image of the pattern 44 being received in the light receiving section 46;

a photoelectric transferring section 47 for transferring the reflected light received in the light receiving section 46 into picture signals, (1) the real image of the pattern 44 being divided into a large number of picture elements in an X-Y plane as shown in FIG. 5, and (2) each divided real image of the pattern 44 being transferred into a picture signal which corresponds to one picture element;

a pattern recognition and calculation section 48 implementing a so-called pattern matching method (1) for successively detecting each block of divided real images of the pattern 44 by scanning the picture signals transmitted from the photoelectric transferring section 47 by a scanner, the dimensions of the block of divided real images agreeing with the prescribed dimensions of the reference picture 44A marked in the center of the pattern 44, (2) for comparing each block of divided real images of the pattern 44 with the reference picture 44A, the reference picture 44A being stored in the section 48 in advance by an operator, (3) for automatically recognizing a specific block of divided real images which matches with the reference picture 44A, and (4) for calculating the difference between the target position of the wafer 43 and the position of the specific block of divided real images, the target position being stored in advance by the operator;

a position correcting section 49

(1) for calculating the difference between the target position of the wafer 43 and the position of the specific block of divided real images transmitted from the pattern recognition and calculation section 48, (2) for transforming the difference to the movement of the wafer 43 in the X and Y directions, and (3) for providing the movement of the wafer 43 to the holding stage section 42, the reference picture 44A formed on the wafer 43 being set at the target position by moving the wafer 43; and a control section 50 for controlling the operation in the holding stage section 42, the pattern recognition and calculation section 48, and the position correcting section 49.

The holding stage section 42 comprises:

a wafer holder 51 for holding the wafer 43;

an X-axis stage 52 for moving the wafer 43 in an X-axis direction;

an X-axis motor 53 for moving the X-axis stage 52 in the X-axis direction to move the wafer 43;

a Y-axis stage 54 for moving the wafer 43 in a Y-axis direction;

a Y-axis motor 55 for moving the Y-axis stage 54 in the Y-axis direction to move the wafer 43; and a stage driving section 56 for driving the motors 53, 54 by a prescribed number of revolutions according to the movement of the wafer 43 transmitted from the position correcting section 49 under the control of the control section 50.

The radiation section 45 is provided with a half mirror 57 for bending the light in a direction of the wafer 43 and for transmitting the light reflected from the wafer 43.

The light receiving section 46 comprises:

a two-visual-field mirror pipe 58 for branching the reflected light transmitted from the radiation section 45 through the wafer 43 into two pieces by utilizing a group of half mirrors (not shown), each branched light passing through an optical path;

a low magnifying lens 59 for magnifying the real image of the pattern 44 imaged in one reflected light branched by the two-visual-field mirror pipe 58, the reflected light passing through one optical path; and a high magnifying lens 60 for magnifying the real image of the pattern 44 imaged in the other reflected light branched by the two-visual-field mirror pipe 58, the other reflected light passing through the other optical path.

The photoelectric transferring section 47 comprises:

a photoelectric transferring device 61A for transferring the reflected light magnified by the low magnifying lens 59 into the picture signals; and a photoelectric transferring device 61B for transferring the reflected light magnified by the high magnifying lens 60 into the picture signals.

The pattern recognition and calculating section 48 is provided with a selector (not shown) for selecting either the picture signals transferred in the photoelectric transferring device 61A or the picture signals transferred in the photoelectric transferring device 61B under the control of the control section 50.

In this embodiment, the picture signals transferred in the photoelectric transferring device 61A are first selected by the pattern recognition and calculation section 48 to roughly correct the position of the wafer 57 in a rough positioning process. Secondly, the picture signals transferred in the photoelectric transferring device 61B are selected by the pattern recognition and calculation section 48 to precisely correct the roughly corrected position of the wafer 57 in a precise positioning process.

The position correcting section 49 comprises:

a roughly position correcting section 62 for transforming the difference between the target position of the wafer 43 and the position of the specific block of the divided real images which are transferred into the picture signals in the photoelectric transferring device 61A to the movement of the wafer 43 to roughly correct the position of the wafer 43 to the target position of the wafer 43, the section 62 being implemented in the rough positioning process; and a precisely position correcting section 63 for transforming the difference between the target position of the wafer 43 and the position of the specific block of the divided real images which are transferred into the picture signals in the photoelectric transferring device 61B to the movement of the wafer 43 to precisely correct the position of the wafer 43 to the target position of the wafer 43, the section 63 being implemented in the precise positioning process.

In the above configuration of the apparatus 41 for positioning a semiconductor wafer 43, each wafer 43 which is stored on a tray (not shown) is set on the wafer holder 51 one by one before the wafer 43 is held by evacuating the wafer holder 51.

When the wafer 43 is held on the wafer holder 51, a light is radiated over the entire wafer 43 from the radiation section 45 so that the light imaging the real image of the pattern 44 formed on the wafer 43 is provided in the two-visual-field mirror pipe 58. Thereafter, the light is branched into two pieces to pass through two optical paths. One branched light images the real image of the pattern 44 in the same manner as the other branched light.

Thereafter, one branched light is magnified by the low magnifying lens 59. In other words, the real image of the pattern 44 imaged in one branched light is magnified at low magnification. In addition, the other branched light is magnified by the high magnifying lens 60. In other words, the real image of the pattern 44 imaged in the other branched light is magnified at high magnification.

One branched light imaging the real image of the pattern 44 magnified in the low magnifying lens 59 is transferred into the picture signals by the photoelectric transferring device 61A. In the same manner, the other branched light imaging the real image of the pattern 44 magnified in the high magnifying lens 60 is transferred into the picture signals by the photoelectric transferring device 61B. In this case, the real image of the pattern 44 is divided into a large number of divided real images. That is, each divided real image corresponds to one picture signal.

Thereafter, the picture signals transferred by the devices 61A, 61B are transmitted to the selector in the pattern recognition and calculation section 48.

In the pattern recognition and calculation section 48, the rough positioning process is first implemented. That is, the real image of the pattern 44 magnified in the low magnifying lens 59 is selected by the selector under the control of the control section 50 because the rough positioning process is first implemented prior to the precise positioning process.

The pattern matching method implemented in the section 48 is described.

(1) Each block of divided real images of the pattern 44 is successively detected by scanning the picture signals transmitted from the photoelectric transferring section 47 by the scanner. In this case, the dimensions of the block of divided real images agree with the prescribed dimensions of the reference picture 44A marked in the center of the pattern 44. Therefore, each block of divided real images can be compared with the reference picture 44A.

(2) Each block of divided real images of the pattern 44 is compared with the reference picture 44A. In this case, the reference picture 44A is stored in the section 48 in advance by the operator.

(3) The specific block of divided real images which matches with the reference picture 44A marked in the center of the pattern 44 is recognized. In this case, because each divided real image is transferred into the corresponding picture signal in the photoelectric transferring device 61A, the recognition process can be automatically implemented. In addition, in cases where a block of divided real images matches with the reference picture 44A marked in the center of the pattern 44 on condition that the block is rotated around a $\theta$-axis by a prescribed angle on the X-Y plane, the block of divided real images is automatically judged to be the specific block of divided real images.

(4) The difference ($\Delta X1$, $\Delta Y1$) between the position of the specific block of divided real images and the target position of the wafer 43 is calculated by utilizing the real image of the pattern 44 magnified in the low magnifying lens 59. In this case, the target position is stored in the section 48 in advance by the operator.

The difference ($\Delta X1$, $\Delta Y1$) is transmitted to the roughly position correcting section 62. In the section 62, the difference ($\Delta X1$, $\Delta Y1$) is transformed to the movement (XC1, YC1) of the wafer 43 as pieces of correction data according to parameters such as an optical magnification of the low magnifying lens 59 under the control of the control section 50. That is, the correction data (XC1, YC1) does not depend on the characteristics of the radiation section 45, the light receiving section 46, the photoelectric transferring section 47, and the pattern recognition and calculation section 48.

Thereafter, the correction data (XC1, YC1) indicating the movement of the wafer 43 is transmitted to the stage driving section 56. In the section 56, the number of revolutions of both the X-axis motor 53 and the Y-axis motor 55 are determined according to the correction data (XC1, YC1) under the control of the control section 50. Therefore, both the X-axis motor 53 and the Y-axis motor 55 are rotated so that the reference picture 44A of the wafer 43 held on the wafer holder 51 is moved towards the target position of the wafer 43.

Accordingly, the reference picture 44A of the wafer 43 can be roughly positioned at the target position in the rough positioning process implemented prior to the precise positioning process.

Thereafter, the precise positioning process is secondly implemented. That is, the real image of the pattern 44 magnified in the high magnifying lens 60 is selected by the selector of the pattern recognition and calculation section 48 under the control of the control section 50. In this case, because the wafer 43 has been roughly positioned at the target position in the rough positioning process, the specific block of divided real images which agrees with the reference picture 44A is necessarily transferred into the picture signals although the real image of the pattern 44 is magnified at high magnification.

Thereafter, the difference ($\Delta X2$, $\Delta Y2$) between the position of the specific block of divided real images and the target position of the wafer 43 is calculated by utilizing the real image of the pattern 44 magnified in the high magnifying lens 60 according to the pattern matching method.

The difference ($\Delta X2$, $\Delta Y2$) is transmitted to the precisely position correcting section 63. In the section 63, the difference ($\Delta X2$, $\Delta Y2$) is transformed to the movement (XC2, YC2) of the wafer 43 as pieces of correction data according to parameters such as an optical magnification of the high magnifying lens 60 under the control of the control section 50. That is, the correction data (XC2, YC2) does not depend on the characteristics of the radiation section 45, the light receiving section 46, the photoelectric transferring section 47, and the pattern recognition and calculating section 48.

Thereafter, the correction data (XC2, YC2) indicating the movement of the wafer 43 is transmitted to the stage driving section 56 of the holding stage section 42. In the section 42, the number of revolutions of both the X-axis motor 53 and the Y-axis motor 55 are determined according to the correction data (XC2, YC2) in the same manner as in the rough positioning process. Therefore, the reference picture 44A of the wafer 43 roughly positioned at the target position in the rough positioning process is precisely moved at the target position of the wafer 43.

Accordingly, the wafer 43 held on the wafer holder 51 can be precisely positioned because the reference picture 44A marked in the center of the pattern 44 is moved at the target position for the wafer 43.

In addition, because the wafer 43 is positioned by implementing the rough and precise positioning processes, the positioning of the wafer 43 can be reliably implemented.

Moreover, because it is judged by the scanner whether or not each block of divided real images of the pattern 44 automatically matches with the reference picture 44A, both a $\theta$-axis stage and a $\theta$-axis motor required for the conventional apparatus 21 are not required in the present invention.

Therefore, the time for the positioning process can be shortened, and the positioning precision can be improved.

In cases where the wafer 43 is required to position with high precision, it is preferable that a multi-visual-field mirror pipe be utilized according to the required precision in place of the two-visual-field mirror pipe 58. In this case, a required number of magnifying lenses of which the optical magnifications differ from one another are utilized in place of the low and high magnifying lenses 59, 60, and a required number of position correcting sections corresponding to the magnifying lenses are provided in place of the roughly and precisely position correcting sections 62, 63. Therefore, the wafer 43 can be gradually positioned to satisfy the required high precision.

The pattern matching method is utilized to recognize the difference between the position of the reference picture 44A and the target position in the pattern recognition and calculating section 48 according to this embodiment. However, the method for recognizing the difference is not limited to the pattern matching method. For example, a so-called feature extracting method is available. In the feature extracting method, each picture signal is scanned by a scanner so that the features of the divided real images are extracted by scanning all the picture signals. Thereafter, one of the features of the divided real images which agrees with the feature of the reference picture 44A is extracted.

The means for radiating a light to the wafer 43 is not limited to the radiation section 45 provided with the half mirror 57. That is, a radiation section utilizing the diffused reflection generated on the wafer 43 is available.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. An apparatus for positioning a semiconductor wafer, on which a pattern of circuits with a reference mark is formed, at a target position, comprising:

light radiating means for radiating a light to the wafer held on a holding stage, the light being reflected on the wafer;

light branching means for optically branching the light which is radiated from the light radiating means and is reflected on the wafer into a plurality of lights, a real image of the pattern being imaged in each branched light;

branched light magnifying means for respectively magnifying the lights branched by the light branching means in a range from low magnification to high magnification, the magnifications of the branched lights differing from one another;

photoelectric transferring means for transferring each branched light magnified by the branched light magnifying means into picture signals;

pattern recognizing and calculation means for automatically recognizing the reference mark of the pattern imaged in each branched light which is transferred into the picture signals by the photoelectric transferring means, and for calculating the difference between the target position and the position of the reference mark, the target position being stored in advance;

movement determining means for determining the movement of the wafer in X and Y directions to reduce the difference calculated by the pattern recognizing and calculation means to zero;

moving means for moving the wafer held on the holding stage in the X and Y directions according to the movement of the wafer determined by the movement determining means; and control means for controlling the processed order of the branched lights which are processed by the pattern recognizing and calculation means, (1) the branched lights being controlled in the order in which the magnification of the branched light increases, (2) the wafer being repeatedly moved by the moving means according to each movement of the wafer determined by utilizing the branched light of which the order is controlled by the control means, and (3) the position of the reference mark on the wafer finally agreeing with the target position by moving the wafer of which the movement is determined by utilizing the branched light magnified at the highest magnification.

2. An apparatus according to claim 1 in which the light which is radiated from the light radiating means and is reflected on the wafer is branched into two lights by the light branching means, (1) one branched light being magnified at low magnification by the branched light magnifying means to utilize for a rough positioning process in which the wafer is roughly positioned, and (2) the other branched light being magnified at high magnification by the branched light magnifying means to utilize for a precise positioning process in which the wafer is precisely positioned.

3. An apparatus according to claim 1 in which the reference mark of the pattern formed on the wafer is drawn in the center of the pattern of circuits.

4. An apparatus according to claim 1 in which the light radiating means is provided with a half mirror for bending the light radiated from the light radiating means toward the wafer and for transmitting the light reflected on the wafer.

5. An apparatus according to claim 1 in which the light branching means is a multi-visual-field mirror pipe for branching the light reflected on the wafer into a plurality of lights, each branched light passing through an optical path.

6. An apparatus according to claim 1 in which the branched light magnifying means is a plurality of magnifying lenses of which the magnifications differ from one another, each light branched by the light branching means being magnified by the corresponding magnifying lens.

7. An apparatus according to claim 1 in which the photoelectric transferring means consists of photoelectric transferring devices by which the lights branched by the light branching means being transferred into the picture signals.

8. An apparatus according to claim 1 in which the pattern recognizing and calculation means is operated according to a pattern matching method in which it is judged whether or not a part of real image of the pattern indicated by a block of picture signals matches with the reference mark of the pattern.

9. An apparatus according to claim 1 in which the wafer is moved in the X and Y direction by motors in the moving means.

* * * * *